US011270898B2

(12) United States Patent
Ramalingam et al.

(10) Patent No.: US 11,270,898 B2
(45) Date of Patent: Mar. 8, 2022

(54) APPARATUS FOR ENHANCING FLOW UNIFORMITY IN A PROCESS CHAMBER

(71) Applicant: APPLIED MATERIALS, INC., Santa Clara, CA (US)

(72) Inventors: Jothilingam Ramalingam, Sunnyvale, CA (US); Kirankumar Neelasandra Savandaiah, Bangalore (IN); Fuhong Zhang, San Jose, CA (US); William Johanson, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 69 days.

(21) Appl. No.: 16/569,593

(22) Filed: Sep. 12, 2019

(65) Prior Publication Data

US 2020/0090957 A1 Mar. 19, 2020

Related U.S. Application Data

(60) Provisional application No. 62/731,950, filed on Sep. 16, 2018.

(51) Int. Cl.
*H01L 21/67* (2006.01)
(52) U.S. Cl.
CPC .... *H01L 21/6719* (2013.01); *H01L 21/67161* (2013.01); *H01L 21/67207* (2013.01)
(58) Field of Classification Search
CPC ........... H01L 21/6719; H01L 21/67207; H01L 21/67161; H01L 21/68785; C23C 16/45502; C23C 16/4585
USPC ........................ 118/715; 156/345.33, 345.34
See application file for complete search history.

(56) References Cited

U.S. PATENT DOCUMENTS

| | | | |
|---|---|---|---|
| 5,855,675 A | 1/1999 | Doering et al. | |
| 6,387,185 B2 | 5/2002 | Doering et al. | |
| 6,537,011 B1 * | 3/2003 | Wang | H01L 21/68707 118/728 |
| 7,011,039 B1 * | 3/2006 | Mohn | H01J 37/321 118/723 R |
| 8,118,044 B2 | 2/2012 | Woodruff | |
| 8,236,105 B2 | 8/2012 | Bera et al. | |
| 2009/0188624 A1 | 7/2009 | Bera et al. | |
| 2011/0005685 A1 * | 1/2011 | Nguyen | H01J 37/321 156/345.43 |

(Continued)

OTHER PUBLICATIONS

Search Report for Taiwan Invention Patent Application No. 108133207 dated May 15, 2020.
U.S. Appl. No. 16/569,593, filed Sep. 12, 2019.

*Primary Examiner* — Rudy Zervigon
(74) *Attorney, Agent, or Firm* — Moser Taboada

(57) ABSTRACT

Methods and apparatus for processing substrates are provided herein. In some embodiments, a shroud for controlling gas flow in a process chamber includes a closed walled body having an upper end and a lower end, the closed walled body defining a first opening of the shroud at the lower end and a second opening of the shroud at the upper end, wherein the second opening is offset from the first opening; and a top wall disposed atop a portion of the upper end of the closed walled body in a position above the first opening to define, together with a remaining portion of the upper end of the closed walled body, the second opening, wherein the shroud is configured to divert a gas flow from the second opening through the first opening.

19 Claims, 7 Drawing Sheets

(56) References Cited

U.S. PATENT DOCUMENTS

2012/0024479 A1     2/2012   Palagashvili et al.
2017/0345623 A1    11/2017   Nguyen et al.

* cited by examiner

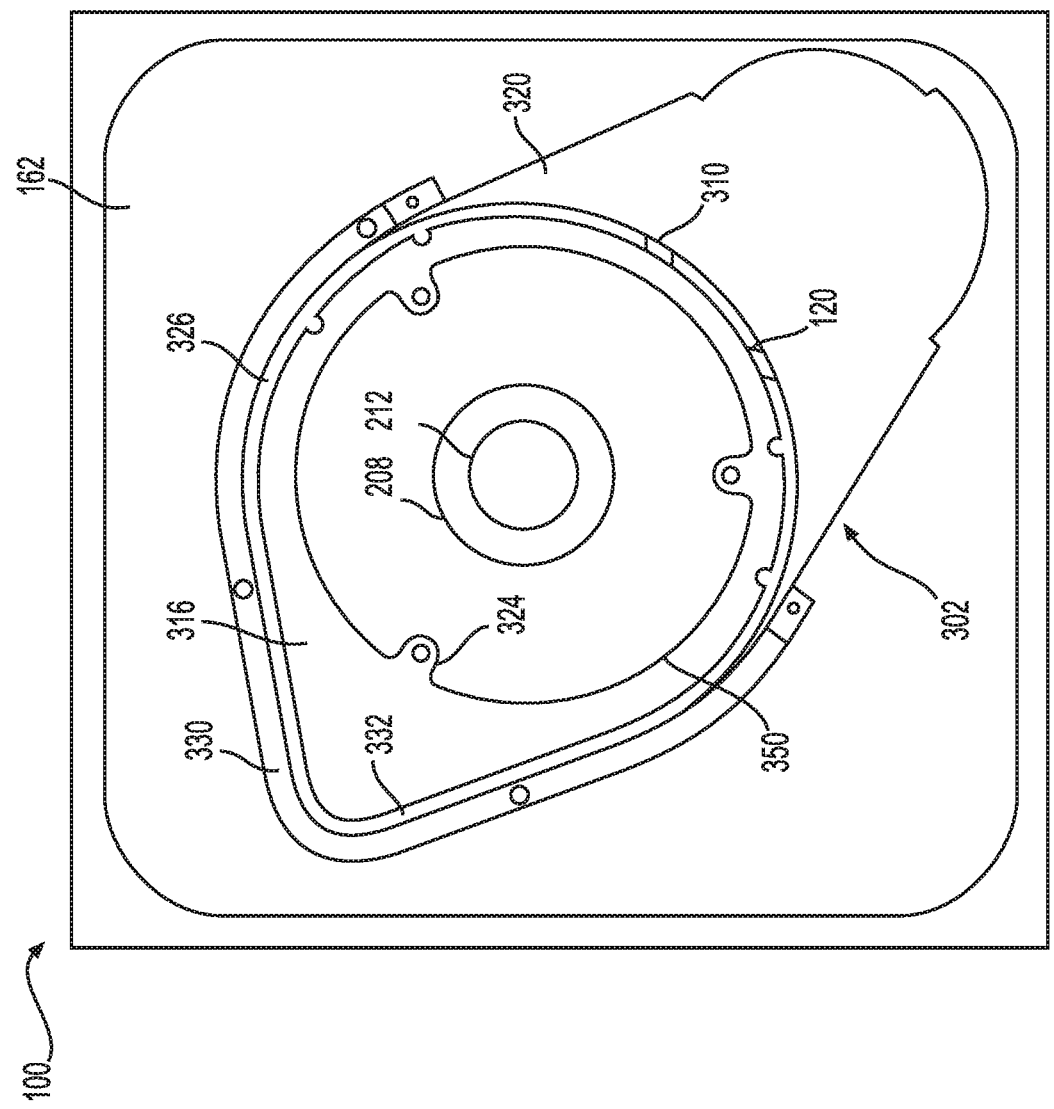

APPARATUS FOR ENHANCING FLOW UNIFORMITY IN A PROCESS CHAMBER

CROSS-REFERENCE TO RELATED APPLICATIONS

This application claims benefit of U.S. provisional patent application Ser. No. 62/731,950, filed Sep. 16, 2018, which is herein incorporated by reference in its entirety.

FIELD

Embodiments of the present disclosure generally relate to semiconductor processing and, more particularly, to apparatus for processing substrates.

BACKGROUND

As the critical dimensions for semiconductor devices continue to shrink, there is an increased need for semiconductor process equipment that can uniformly process semiconductor substrates. One instance of where such a need may arise is in controlling the flow of process gases proximate the surface of a substrate disposed in a process chamber. The inventors have observed that, in conventional process chambers that utilize a single pump to exhaust process gases from a side of the process chamber, process non-uniformities (for example, non-uniform etch rates in an etch chamber, non-uniform depositing of process material) exist that are believed to be due, at least in part, to non-uniform flow of process gases in the process chamber. Also, the inventors have observed that non-uniform flow of process gases in the process chamber may lead to thick deposition on a process shield and cause further process non-uniformities.

Accordingly, the inventors have provided an improved apparatus for processing substrates.

SUMMARY

Methods and apparatus for processing substrates are provided herein. In some embodiments, a shroud for controlling gas flow in a process chamber includes a closed walled body having an upper end and a lower end, the closed walled body defining a first opening of the shroud at the lower end and a second opening of the shroud at the upper end, wherein the second opening is offset from the first opening; and a top wall disposed atop a portion of the upper end of the closed walled body in a position above the first opening to define, together with a remaining portion of the upper end of the closed walled body, the second opening, wherein the shroud is configured to divert a gas flow from the second opening through the first opening.

In some embodiments, a shroud for controlling gas flow in a process chamber includes a first closed wall defining a first opening and having a lower end and an upper end, a second closed wall surrounding the first closed wall, wherein the second closed wall has a lower end that is coplanar with the lower end of the first closed wall and an upper end that is higher than the upper end of the first closed wall, and a top wall disposed atop a portion of the upper end of the second closed wall in a position above the first opening to define, together with the remaining portion of the upper end of the second closed wall, a second opening that is offset from the first opening.

In some embodiments, a process chamber includes a substrate support to support a substrate; a process shield disposed about the substrate support; a pump port disposed in a lower portion of the process chamber in a position that provides asymmetric pumping from the process chamber; and a shroud disposed between the substrate support and the pumping port, wherein the shroud includes a first opening at a lower end and a second opening at an upper end, wherein the second opening is offset from the first opening, and wherein the shroud is configured to direct a gas flow through the shroud toward the pumping port through the second opening and the first opening.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. The appended drawings illustrate some embodiments of the disclosure and are therefore not to be considered limiting of scope, for the disclosure may admit to other equally effective embodiments.

FIG. 3 shows a top plan view of a shroud arranged in a process chamber in accordance with at least some embodiments of the present disclosure.

Figure 1:
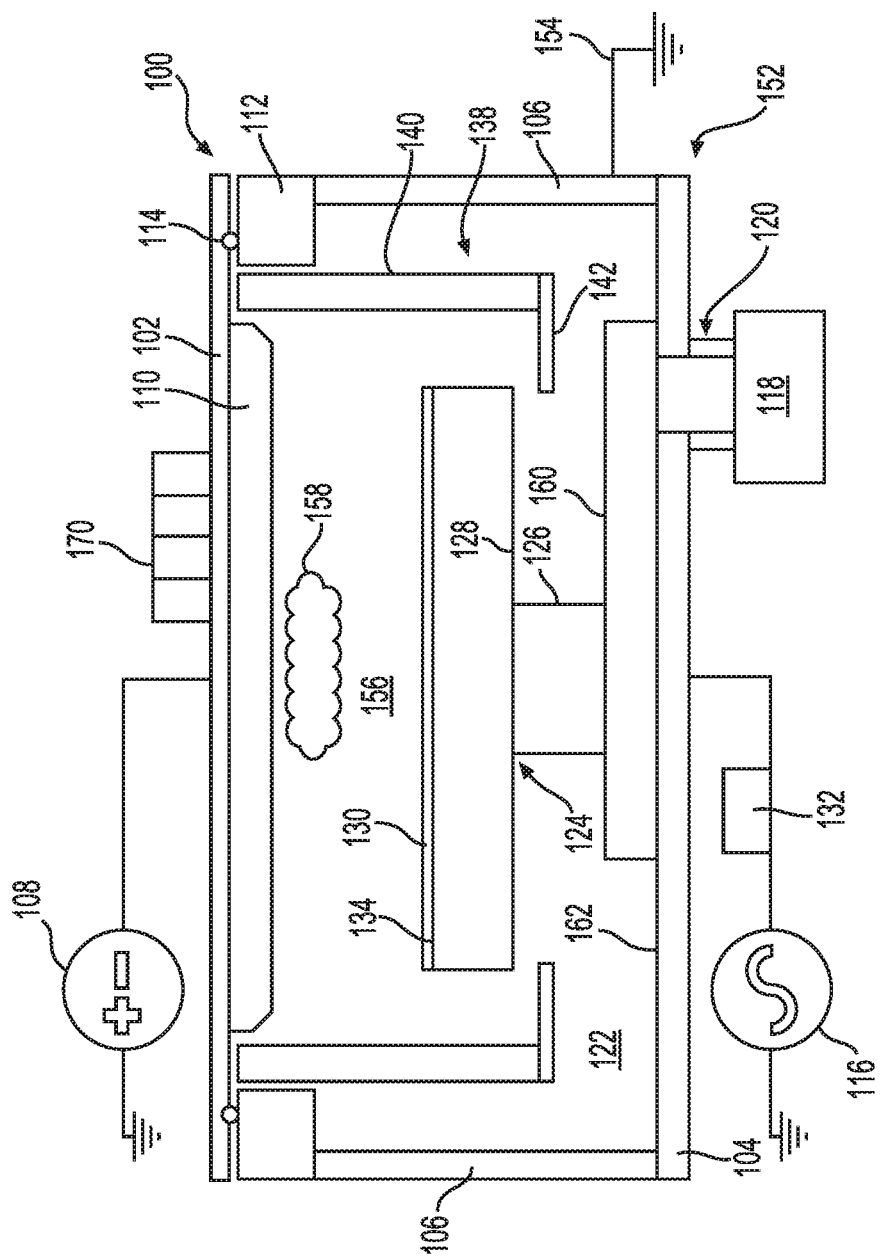
FIG. 1 depicts a schematic side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide an apparatus for processing a substrate (e.g., a process chamber) having an improved exhaust system for the removal of process gases. The improved exhaust system facilitates providing more uniform flow of gases proximate the surface of a substrate disposed within the apparatus. Such uniform flow of gases proximate the surface of the substrate may facilitate more uniform processing of the substrate.

Figure 7:
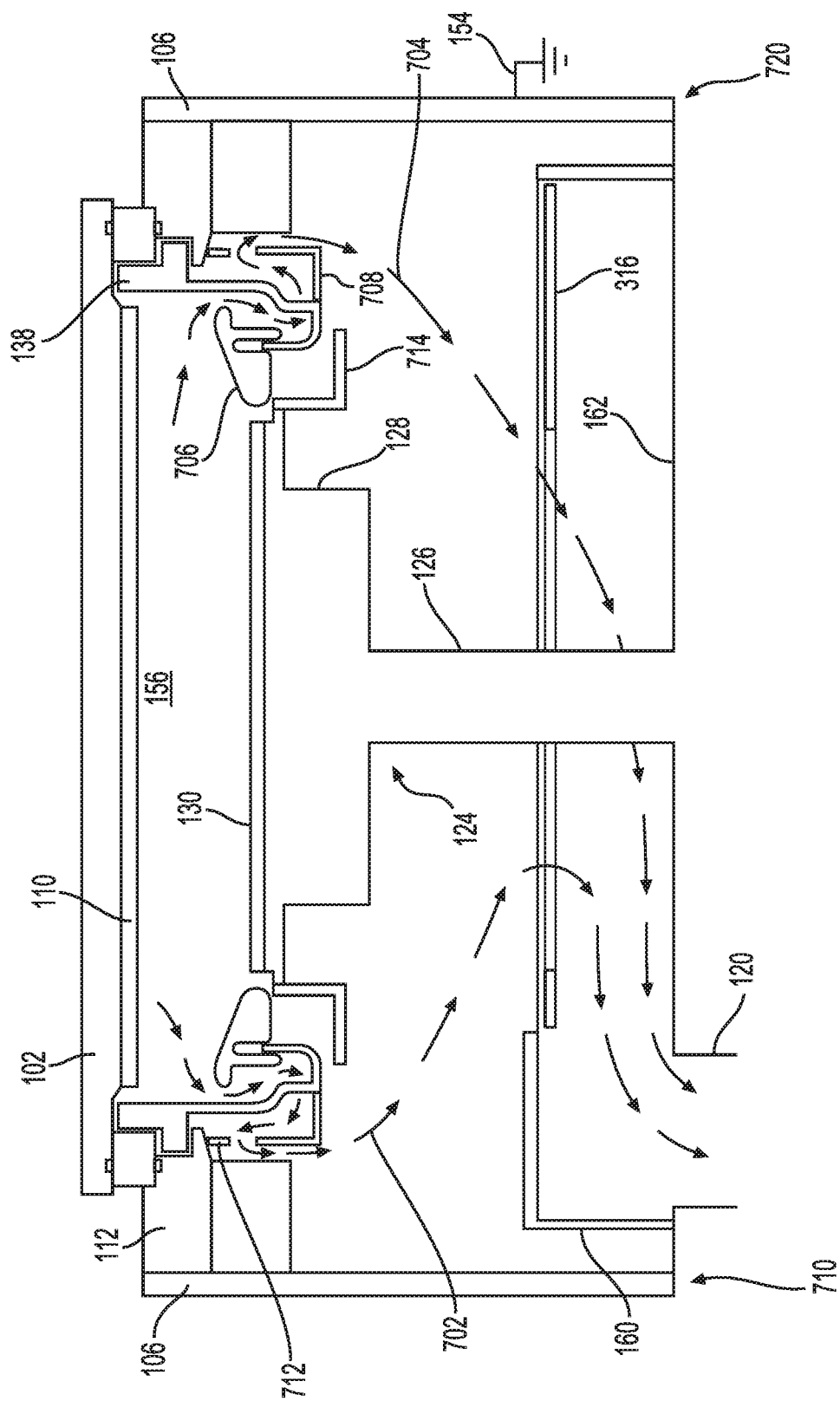
FIG. 7 depicts a schematic side view of a process chamber in accordance with at least some embodiments of the present disclosure.

For example, FIGS. 1 and 7 depict schematic side views of a process chamber that is suitable for performing the methods described herein in accordance with some embodiments of the present disclosure. The specific configuration of the process chamber is illustrative and process chambers having other configurations may also benefit modifications in accordance with the teachings provided herein. Examples of suitable process chambers include any of the ENDURA® line of PVD processing chambers, commercially available from Applied Materials, Inc., of Santa Clara, Calif. Other processing chambers from Applied Materials, Inc. or other manufactures may also benefit from the inventive apparatus and method disclosed herein.

As shown in FIG. 1, a process chamber 100 for performing a PVD process includes a chamber body 152. The chamber body 152 generally includes a top wall 102 (or lid), a bottom wall 104, and sidewalls 106 that connect the top wall 102 to the bottom wall 104. The top wall 102, the bottom wall 104, and the sidewalls 106 define an interior volume 122. The bottom wall 104 includes a floor 162 on a side facing the interior volume 122. In some embodiments, the chamber body 152 includes an adapter 112 that extends radially inward from the sidewalls 106. The adapter 112 may be part of the sidewalls 106 or may be a separate component. In some embodiments, the adapter 112 may be part of a process shield. The top wall 102 may be coupled to the sidewalls 106 via the adapter 112. In some embodiments, a seal ring 114 may be disposed between the adapter 112 and the top wall 102 to prevent ingress or egress of fluid between the adapter 112 and the top wall 102 (e.g., during processing with vacuum pressures in the interior volume 122). The top wall 102 is generally removable from the sidewalls 106, for example, to facilitate maintenance or replacement of target 110. The chamber body 152 may be grounded via a coupling to ground 154. The top wall 102 can be electrically floating or grounded.

A pump port 120 is disposed in a lower portion of the process chamber 100 in a position that provides asymmetric pumping from the process chamber 100. As shown in FIG. 1, the pump port 120 is disposed in an opening of the bottom wall 104. In some embodiments, a pump 118, such as a turbo pump or cryogenic pump, is coupled to the pump port 120. The pump 118 is configured to regulate a pressure within the chamber body 152, such as to maintain a vacuum. In some embodiments, the pump 118 is configured to evacuate gases introduced in the interior volume 122 during the deposition process. In some embodiments, the pump 118 is configured to evacuate gases formed during the deposition process.

A substrate support 124 is disposed in the interior volume 122. In some embodiments, the substrate support 124 includes a shaft 126 and a pedestal 128. The shaft 126 can include conduits to provide, for example, fluids, coolants, power, or the like to the pedestal 128. The pedestal 128 has an upper surface 134 that is configured to receive a substrate 130 (such as a 200 mm, 300 mm, or the like wafer or a substrate having some other form factor) for processing. The substrate support 124 is configured to support the substrate 130 such that a center of the substrate 130 is aligned with a central axis of the process chamber 100 (or of the processing volume 156, discussed below).

The substrate support 124 is coupled one or more bias power source (one power source 116 shown) through one or more matching networks (one matching network 132 shown). In some embodiments, the power source 116 is configured to induce an AC bias or a DC bias on the substrate 130. In some embodiments, the bias power source may be a DC or pulsed DC source.

A target 110 is disposed within the interior volume 122 of the chamber body 152. The target 110 is disposed opposing the substrate support 124. For example, the target 110 may be coupled to the top wall 102. The process chamber 100 includes a power source 108 and an associated magnetron 170 coupled to the target 110. The power source 108 is configured to provide energy to the target 110 to form a plasma 158. The target 110 comprises a source material to be deposited on the substrate 130 during sputtering. In some embodiments, the source material may be a metal, metal oxide, metal alloy, or the like. In some embodiments, the target 110 may include a backing plate comprising a conductive material, such that the power source 108 can be coupled to the target 110 via the backing plate.

A process shield 138 having an upper portion 140 and a lower portion 142 is disposed in the interior volume 122. In some embodiments, the process shield 138 has a cylindrical body. In some embodiments, the process shield 138 comprises a single piece metal body. In some embodiments, the process shield 138 comprises a single piece body that includes the adapter 112. The lower portion 142 surrounds the substrate support 124. In some embodiments, the upper portion 140 is disposed about and spaced apart from the target 110 to form a gap 150 between the upper portion 140 of the process shield 138 and the target 110. The process shield 138, the target 110, and the substrate support define a processing volume 156 within the interior volume 122. A gas inlet is configured to flow one or more process gas to the processing volume 156. In some embodiments, the process gas is reactive. In some embodiments, the process gas is inert, such as argon (Ar), nitrogen (N), or the like. The gas inlet may comprise one or more gas inlets. In some embodiments, the gas inlet is configured to uniformly distribute gas to the processing volume 156 from a source exterior to the process chamber 100.

A shroud 160 is disposed in a lower portion of the process chamber 100 between the substrate support 124 and the pump port 120. The shroud 160 comprises a closed walled body having an upper end and a lower end, the closed walled body including a first opening and a second opening (discussed below). The shroud 160 is configured to direct a gas flow through the shroud 160 toward the pump port 120. In some embodiments, the shroud 160 is made of a metal having beneficial reflective properties, such as stainless steel.

Figure 2:
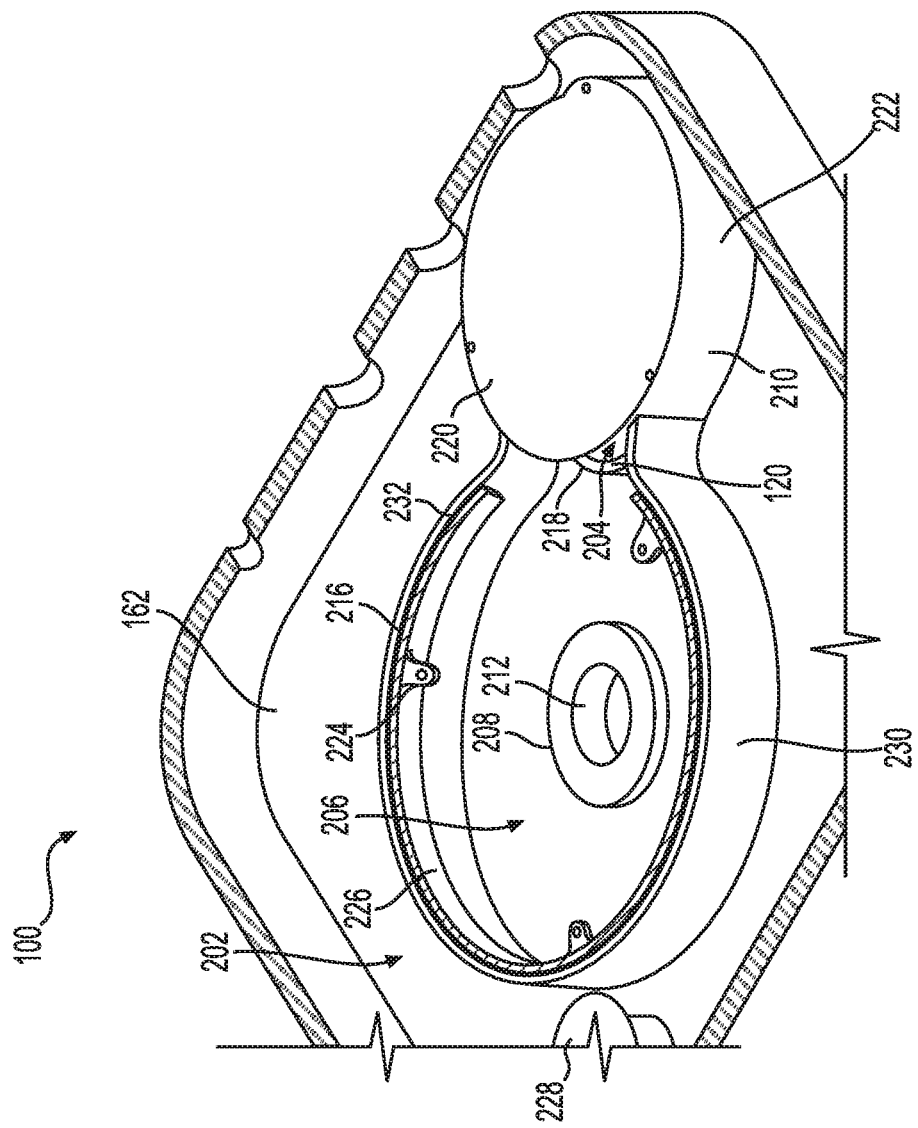
FIG. 2 shows a partial top isometric view of a shroud arranged in a process chamber in accordance with at least some embodiments of the present disclosure.

FIG. 2 shows a partial top isometric view of a shroud arranged in a process chamber in accordance with at least some embodiments of the present disclosure. In some embodiments, the shroud 202 is coupled to the floor 162 of the process chamber 100. A support ring 208 is coupled to the floor 162. The support ring 208 has an opening 212 that is concentric with an opening in the floor 162 for the substrate support 124. The shroud 202 includes a first opening 204 and a second opening 206. In some embodiments, the first opening 204 has a substantially circular shape.

In some embodiments, the closed walled body of the shroud 202 includes a first body 210, a second body 220, and a third body 230. In some embodiments, the first body 210, the second body 220, and the third body 230 are separate components that may be coupled together. In some embodiments, the first body 210, the second body 220, and the third body 230 are one component formed of a single piece of material. In some embodiments, at least two of the first body 210, the second body 220, and the third body 230 are one component formed of a single piece of material. For example, in some embodiments, the first body 210 and the second body 220 are formed of a single piece of material and coupled to the third body 230.

The first body 210 has an annular shape and defines the first opening 204. In some embodiments, the first body 210 includes a first portion 218 and a second portion 222. The first portion 218 and the second portion 222 are coplanar on a side facing the floor 162 (i.e., lower end of the first body 210). The first portion 218 is lower than the second portion 222 on a side of the first body 210 facing away from the floor 162 (i.e., upper end of the first body 210). The first body 210 is disposed about the pump port 120.

The second body 220 is disposed on top of the first body 210 and covers the first opening 204. In some embodiments, the second body 220 is coupled to the second portion 222 of the first body 210. The third body 230 is coupled to the first body 210. In some embodiments, the third body 230 and the second body 220 define the second opening 206 of the shroud 202. The shroud 202 is configured to divert a gas flow from the second opening 206 through the first opening 204.

In some embodiments, a hoop lift 216 is coupled to a lift mechanism 228, such as a motor, actuator, or the like. The hoop lift 216 includes a ring portion 226 that is sized to fit within the third body 230. In some embodiments, there is a gap 232 between the ring portion 226 and the third body 230. In some embodiments, the gap 232 is about 0.1 inches to about 0.25 inches. In some embodiments, the hoop lift 216 includes a plurality of tabs 224 that extend radially inwards from the ring portion 226. The plurality of tabs 224 include an opening for accommodating lift pins (discussed below). The hoop lift 216 may include a lip that extends radially outwards from the ring portion 226. In some embodiments, the lip overlays the third body 230. The lift mechanism 228 is configured to raise and lower the hoop lift 216 to raise and lower the substrate 130. In some embodiments, the hoop lift 216 together with the third body 230 and the second body 220 define the second opening 206.

FIG. 3 shows top plan view of a shroud arranged in a process chamber in accordance with at least some embodiments of the present disclosure. In some embodiments, the shroud 302 is coupled to the floor 162 of the process chamber 100. The shroud 302 includes a first opening 304 and a second opening 306. In some embodiments, the shroud 202 includes a first body 310, a second body 320, and a third body 330.

Figure 4A:
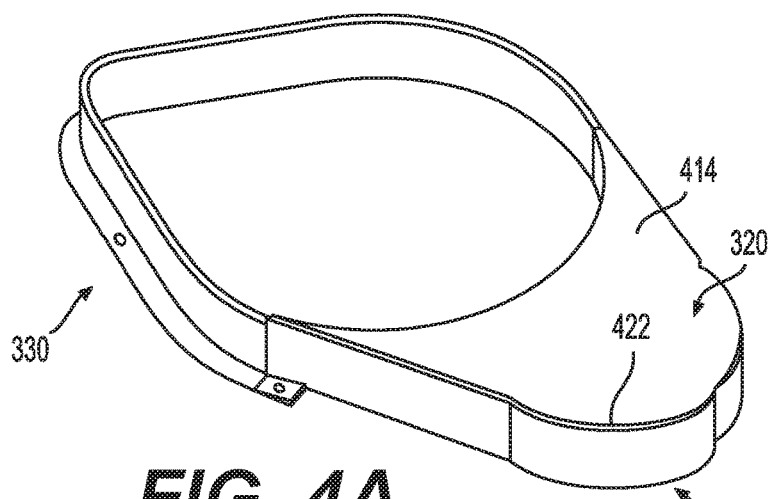
FIGS. 4A-D show various views of components of the shroud of FIG. 3 in accordance with at least some embodiments of the present disclosure.
Figure 4B:
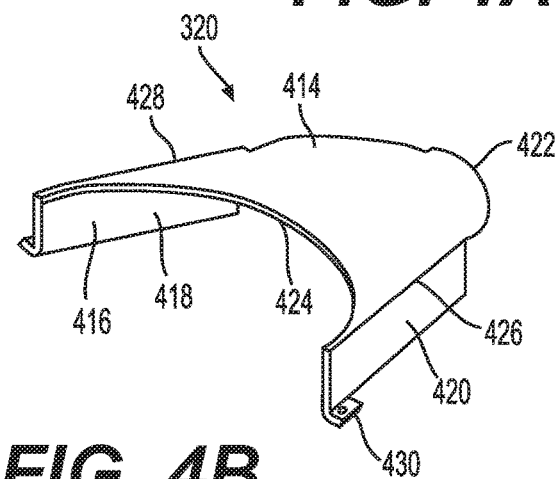
Figure 4C:
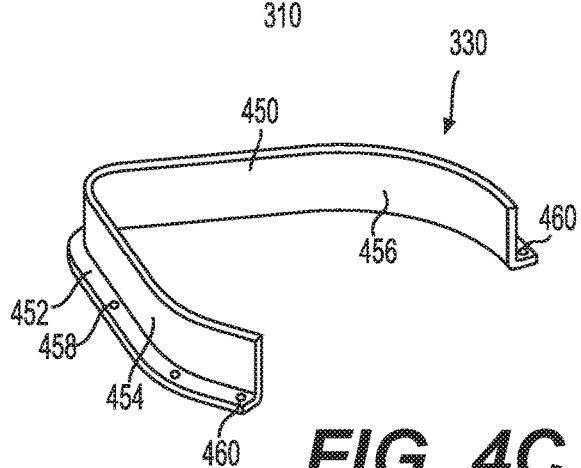
Figure 4D:
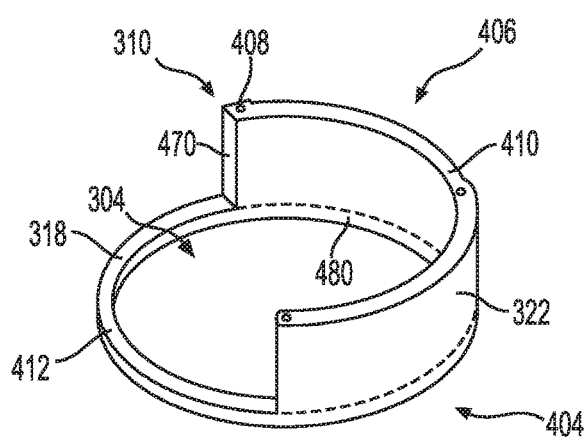

FIGS. 4A-D show various views of components of the shroud of FIG. 3 in accordance with at least some embodiments of the present disclosure. FIG. 4D shows the first body 310 in accordance with some embodiments of the present disclosure. The first body 310 has an annular shape and defines the first opening 304. In some embodiments, the first body 310 includes a first portion 318 and a second portion 322. The first portion 318 and the second portion 322 are coplanar on a lower side 404 facing the floor 162. The second portion 322 is higher than the first portion 318 on an upper side 406 of the first body 210 facing away from the floor 162. The first portion 318 has an upper surface 412. The second portion 322 has an upper surface 410. In some embodiments, the upper surface 410 includes one or more holes 408 capable of receiving a fastener. In some embodiments, the first body 310 includes a bottom portion 480 (below dotted line shown in FIG. 4D) and a top portion 470 (above dotted line shown in FIG. 4D).

FIG. 4B shows the second body 320 in accordance with some embodiments of the present disclosure. The second body 320 includes a planar surface 414 and sidewalls 416 extending downwards from opposing sides of the planar surface 414. In some embodiments, the planar surface 414 is defined by a pair of linear edges 426, 428 that connect a first curved edge 422 and a second curved edge 424. In some embodiments, the sidewalls 416 extend from the pair of linear edges 426, 428. The sidewalls 416 include an inner surface 418 and an outer surface 420. In some embodiments, a tab 430 extends from an outer surface 420 of each sidewall 416 at an end opposite the planar surface 414. In some embodiments, the first curved edge 422 extends away from the sidewalls 416. In some embodiments, the second curved edge 424 extends towards the first curved edge 422. When shroud 302 is installed in the process chamber 100, the shape of the second curved edge 424 advantageously provides an opening for gas flow that allows gas to be pumped out of the process chamber 100 at a rate that is similar as the rate of gas flow in the process chamber 100 without the shroud 302 installed.

FIG. 4C shows the third body 330 in accordance with some embodiments of the present disclosure. As shown, third body 330 includes a wall 450 having an inner surface 456 and an outer surface 454. The third body 330 includes a lip 452 extending away from a lower end of the outer surface 454 of the wall 450. In some embodiments, the lip 452 includes one or more mounting holes 458 to mount the third body 330 to the floor 162. In some embodiments, the lip includes a pair of holes 460 configured to couple the third body 330 to the tabs 430 of the second body 320. In some embodiments, the third body 330 has an open loop shape.

As shown in FIG. 4A, the second body 320 is disposed on top of the first body 310 and covers the first opening 304. In some embodiments, the second body 320 is coupled to the second portion 322 of the first body 310 via holes 408. In some embodiments, the third body 330 is coupled to the first body 310. In some embodiments, the first body 310, the second body 320, and the third body 330 are coplanar at a lower end. In some embodiments, the third body 330 and the second body 320 define the second opening 306 of the shroud 302. In some embodiments, the second opening 206 is further defined by a central opening 350 of a hoop lift 316 disposed in the shroud 302. The shroud 302 is configured to divert a gas flow from the second opening 306 through the first opening 304.

In some embodiments, the shroud 302 includes a first closed wall, a second closed wall, and a top wall. In some embodiments, the first closed wall is defined by a radially inward portion of the bottom portion 480 of the first body 310. The first closed wall defines a first opening 304 and has a lower end and an upper end. In some embodiments, the second closed wall is defined by the second body 320, the third body 330, the top portion 470 and a radially outer portion of the first body 310. In some embodiments, the second closed wall surrounds the first closed wall, wherein the second closed wall has a lower end that is coplanar with the lower end of the first closed wall and an upper end that is higher than the upper end of the first closed wall. In some embodiments, the top wall (i.e., planar surface 414) is disposed atop a portion of the upper end of the second closed wall. In some embodiments, the top wall is disposed in a position above the first opening 304 to define, together with the remaining portion of the upper end of the second closed wall, a second opening 306 that is offset from the first opening 304.

Figure 5:
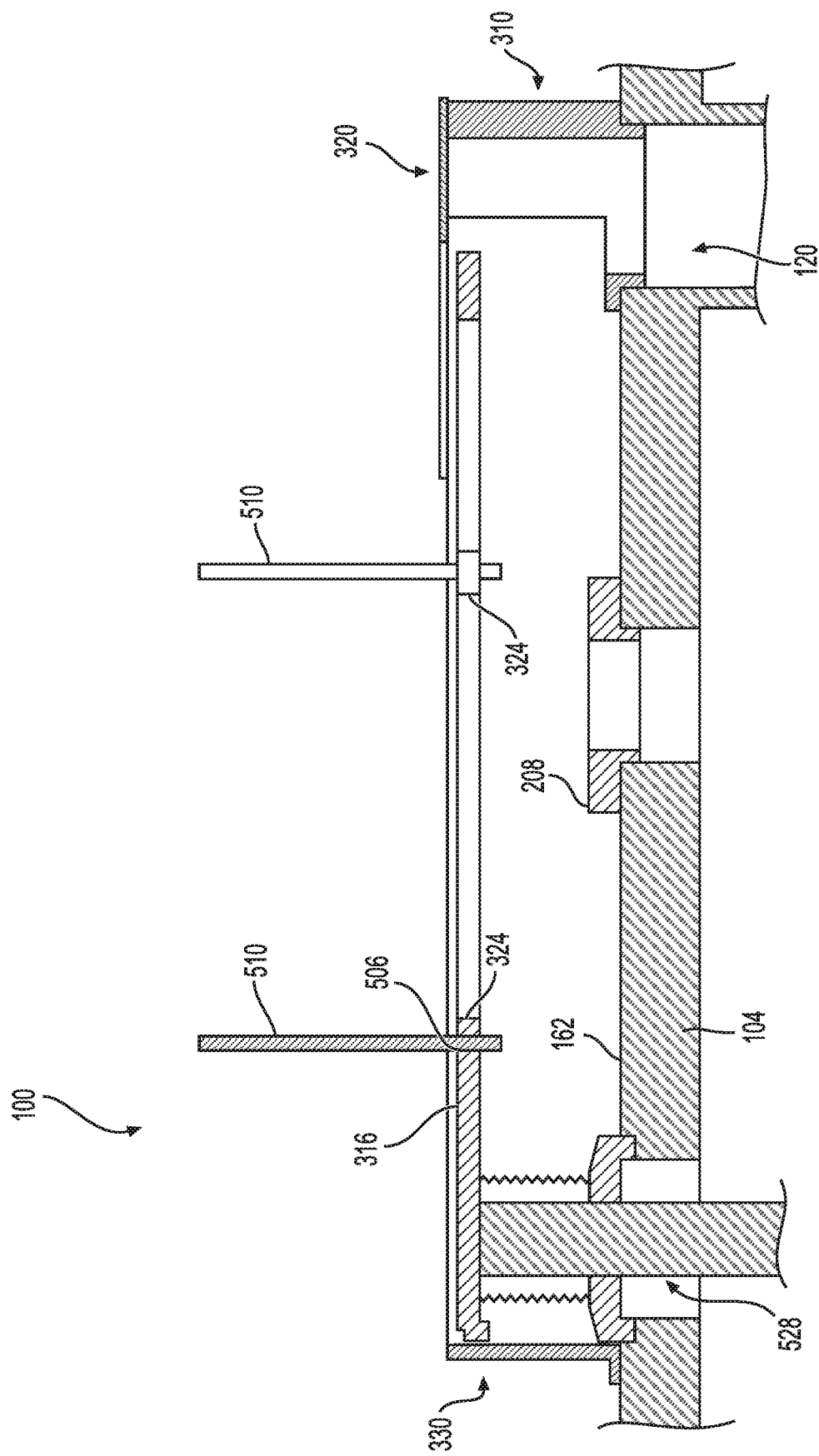
FIG. 5 shows a partial cross sectional side view of the shroud of FIG. 3 in accordance with at least some embodiments of the present disclosure.

FIG. 5 shows a partial cross sectional side view of the shroud of FIG. 3 in accordance with at least some embodiments of the present disclosure. In some embodiments, the hoop lift 316 is coupled to a lift mechanism 528, similar to lift mechanism 228. In some embodiments, the hoop lift 316 is sized to fit within the third body 330. In some embodiments, there is a gap 332 between the outer surface 326 of the hoop lift 316 and the third body 330. In some embodiments, the gap 332 is about 0.1 inches to about 0.25 inches. In some embodiments, the hoop lift 316 includes a plurality of tabs 324 that extend radially inwards from the hoop lift 316. In some embodiments, each tab of the plurality of tabs 324 includes an opening 506 for accommodating a lift pin 510. The lift mechanism 528 is configured to raise and lower the hoop lift 316 to raise and lower the substrate 130. The hoop lift 316 has a thickness that advantageously maintains a substantially closed volume with the shroud 302 while the hoop lift 316 is raised or lowered.

Figure 6A:
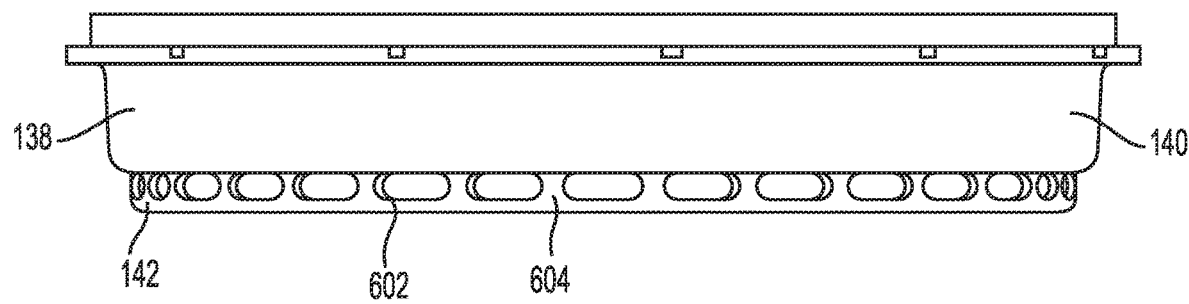
FIG. 6A shows a side view of a process shield in accordance with at least some embodiments of the present disclosure.
Figure 6B:
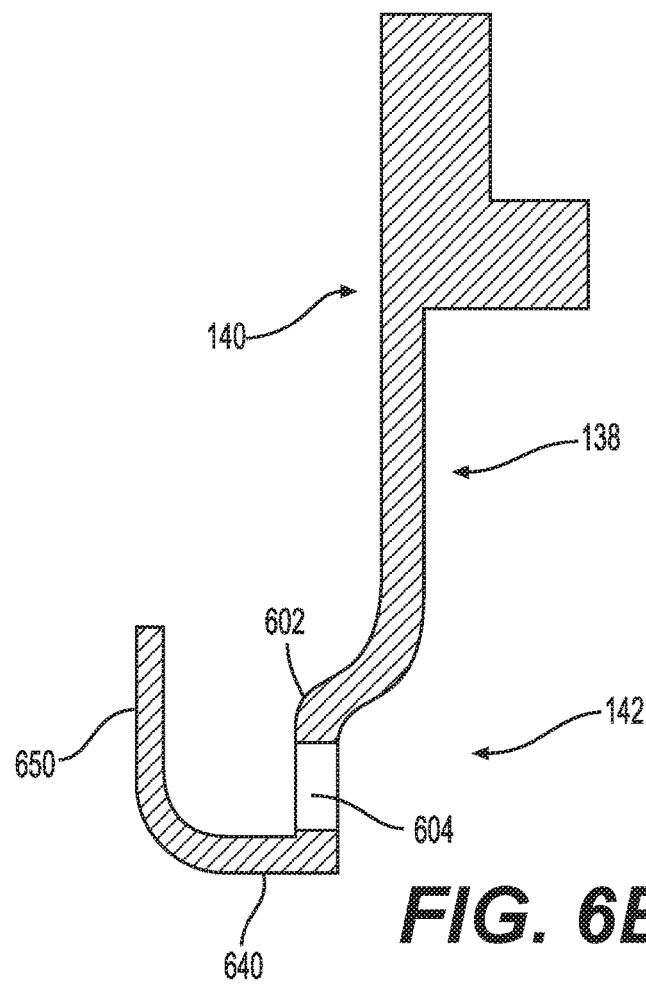
FIG. 6B shows a cross sectional side view of a portion of the process shield of FIG. 6A in accordance with at least some embodiments of the present disclosure.

FIG. 6A shows a side view of a process shield in accordance with at least some embodiments of the present disclosure. FIG. 6B shows a cross sectional side view of a portion of the process shield of FIG. 6A in accordance with at least some embodiments of the present disclosure. In some embodiments, the process shield 138 has an annular shape. The process shield 138 includes an upper portion 140 and a lower portion 142. The lower portion 142 includes a first portion 604 that extends from the upper portion 140. In some embodiments, a second portion 640 extends radially inwards from the first portion 604. In some embodiments, a third portion 650 extends upwards from the second portion 640. The first portion 604 includes a plurality of openings 602. In some embodiments, the plurality of openings 602 have an oval shape. In some embodiments, the plurality of openings 602 have a circular shape. In some embodiments, each opening of the plurality of openings 602 has a width of about 0.7 inches to about 2 inches. In some embodiments, each opening of the plurality of openings 602 has a height of about 0.25 inches to about 1.5 inches. The plurality of openings 602 are advantageously sized to reduce deposition build up during processing and to improve a disappearing anode issue in the process shield 138.

FIG. 7 depicts a schematic side view of a process chamber in accordance with at least some embodiments of the present disclosure. The process chamber 100 has a first side 710 and a second side 720 opposite the first side 710. In some embodiments, the process chamber 100 includes a cover ring 706 having an annular shape disposed between the substrate support 124 and the process shield 138. In some embodiments, the process chamber 100 includes a secondary process shield 708 having a plurality of openings 712. In some embodiments, the substrate support 124 includes a grounding plate 714 disposed about an outer edge of the pedestal 128. In some embodiments, the grounding plate 714 has an "L" shaped cross section. The ground plate is coupled to grounding loops (not shown). The ground plate 714 and the grounding loops are configured to provide a ground path from the substrate support 124 to the process shield 138.

A first gas flow path 702 is disposed near the first side 710. The first gas flow path 702 extends from the processing volume 156 to the pump port 120 via the shroud 160. In some embodiments, the first gas flow path 702 is configured to pass through an opening between the process shield 138 and a cover ring 706, through the plurality of openings 602 of the process shield 138, through the plurality of openings 712 of the secondary process shield 708, and through an opening between the substrate support 124 and the shroud 160.

A second gas flow path 704 is disposed near the second side 720. The second gas flow path 704 extends from the processing volume 156 to the pump port 120 via the shroud 160. In some embodiments, the second gas flow path 704 is configured to pass through an opening between the process shield 138 and a cover ring 706, through the plurality of openings 602 of the process shield 138, through the plurality of openings 712 of the secondary process shield 708, and through an opening between the substrate support 124 and the shroud 160. The shroud 160 advantageously is capable of providing a more symmetric pumping of process gases when a pump port 120 is disposed asymmetrically within the process chamber 100.

Thus, methods and apparatus for processing substrates have been provided herein that provide improved uniformity of gas flow proximate the surface of a substrate. The improved uniformity of gas flow facilitates improvement of substrate processing, such as etching, deposition, or other processes that may benefit from uniformity of gas flow.

While the foregoing is directed to embodiments of the present disclosure, other and further embodiments of the disclosure may be devised without departing from the basic scope thereof.

What is claimed is:

1. A shroud for controlling gas flow in a process chamber, comprising:
   a closed walled body having an upper end and a lower end, the closed walled body defining a first opening of the shroud at the lower end and a second opening of the shroud at the upper end, wherein the second opening is offset from the first opening; and
   a top wall disposed atop a portion of the upper end of the closed walled body in a position above the first opening to define, together with a remaining portion of the upper end of the closed walled body, the second opening, wherein the shroud is configured to divert a gas flow from the second opening to a volume below the second opening, then horizontally across to a volume above the first opening, and then downward through the first opening.

2. The shroud of claim 1, wherein the closed walled body comprises:
   a first body having an annular shape and defining the first opening of the shroud;
   a second body disposed on top of the first body and covering the first opening; and
   a third body coupled to at least one of the first body or the second body, wherein the third body and the second body define the second opening of the shroud.

3. The shroud of claim 2, wherein the second body includes a planar surface that defines the top wall and sidewalls extending from opposing sides of the planar surface towards the first opening, and wherein the second body has a flat upper surface extending from the second opening to an outer surface of the shroud.

4. The shroud of claim 1, wherein the shroud has a line of sight from the first opening to the second opening.

5. The shroud of claim 2, wherein the third body includes a wall having an inner surface and an outer surface and a lip extending away from the outer surface of the wall.

6. The shroud of claim 2, wherein the first body includes a first portion and a second portion, wherein the second portion is raised from the first portion.

7. The shroud of claim 6, wherein an upper surface of the second portion of the first body is coupled to the second body.

8. The shroud of claim 2, wherein the second body includes a planar surface that is defined by a pair of linear edges that connect a first curved edge and a second curved edge.

9. A shroud for controlling gas flow in a process chamber, comprising:
   a first closed wall defining a first opening and having a lower end and an upper end;

a second closed wall having a lower end surrounding the first closed wall, wherein the lower end of the second closed wall is coplanar with the lower end of the first closed wall, and wherein an upper end of the second closed wall is higher than the upper end of the first closed wall; and a top wall disposed atop a portion of the upper end of the second closed wall in a position above the first opening to define, together with a remaining portion of the upper end of the second closed wall, a second opening that is offset from the first opening, wherein a gas flow path extends from the second opening, through a region between the top wall and the first closed wall to the first opening, wherein the shroud has a line of sight from the first opening to the second opening.

10. The shroud of claim 9, wherein the top wall includes a planar surface defined by a pair of linear edges that connect a first curved edge and a second curved edge.

11. The shroud of claim 10, wherein the second curved edge extends towards the first curved edge.

12. The shroud of claim 9, wherein the second closed wall includes a lip extending away from the lower end of the second closed wall.

13. The shroud of claim 9, wherein the first opening has a substantially circular shape.

14. A process chamber, comprising:
a substrate support to support a substrate;
a process shield disposed about the substrate support, wherein the process shield includes an upper portion and a lower portion, the lower portion having a plurality of openings extending radially outward through the lower portion;

a pump port disposed in a lower portion of the process chamber in a position that provides asymmetric pumping from the process chamber; and a shroud disposed between the substrate support and the pumping port, wherein the shroud includes a first opening at a lower end and a second opening at an upper end, wherein the second opening is disposed below an upper surface of the substrate support and is offset from the first opening, and wherein the shroud is configured to direct a gas flow through the shroud toward the pumping port through the second opening and the first opening.

15. The process chamber of claim 14, wherein the shroud includes a first body, a second body, and a third body, wherein the third body is fixed to a bottom wall of the process chamber.

16. The process chamber of claim 15, further comprising a hoop lift having a ring portion sized to fit within the third body disposed within the shroud.

17. The process chamber of claim 16, wherein the hoop lift includes lift pins.

18. The process chamber of claim 14, wherein the shroud includes a first body having an annular shape and disposed about the pump port.

19. The process chamber of claim 14, wherein the plurality of openings have an oval shape.

* * * * *